United States Patent
Teshigahara et al.

(10) Patent No.: US 9,735,342 B2
(45) Date of Patent: Aug. 15, 2017

(54) PIEZOELECTRIC THIN FILM AND METHOD FOR PRODUCING THE SAME

(71) Applicants: DENSO CORPORATION, Kariya, Aichi-pref. (JP); NATIONAL INSTITUTE OF ADVANCED INDUSTRIAL SCIENCE AND TECHNOLOGY, Chiyoda-ku, Tokyo (JP)

(72) Inventors: Akihiko Teshigahara, Kariya (JP); Kazuhiko Kano, Kariya (JP); Morito Akiyama, Tosu (JP); Keiko Nishikubo, Tosu (JP)

(73) Assignees: DENSO CORPORATION, Kariya (JP); NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 7 days.

(21) Appl. No.: 14/888,278

(22) PCT Filed: May 22, 2014

(86) PCT No.: PCT/JP2014/002697
§ 371 (c)(1),
(2) Date: Oct. 30, 2015

(87) PCT Pub. No.: WO2014/192265
PCT Pub. Date: Dec. 4, 2014

(65) Prior Publication Data
US 2016/0064645 A1 Mar. 3, 2016

(30) Foreign Application Priority Data
May 31, 2013 (JP) .................................. 2013-115477

(51) Int. Cl.
*H01L 41/18* (2006.01)
*H01L 41/39* (2013.01)
(Continued)

(52) U.S. Cl.
CPC .............. *H01L 41/18* (2013.01); *C23C 14/06* (2013.01); *C23C 14/18* (2013.01); *C23C 14/185* (2013.01);
(Continued)

(58) Field of Classification Search
CPC ........ C04B 35/581; H01L 41/18; H01L 41/39
See application file for complete search history.

(56) References Cited

U.S. PATENT DOCUMENTS 6,454,910 B1 * 9/2002 Zhurin ................ C23C 14/0031
204/192.12
2008/0056984 A1 3/2008 Yoshioka et al.
(Continued)

FOREIGN PATENT DOCUMENTS

JP 2009-149953 A 7/2009
JP 2011-046580 A 3/2011
(Continued)

OTHER PUBLICATIONS

Akiyama. Preparation of scandium aluminum nitride thin films by using scandium aluminum alloy sputtering target and design of experiments. Journal of the Ceramic Society of Japan 118 [12] 1166-1169 2010.*
(Continued)

*Primary Examiner* — Matthew E Hoban
(74) *Attorney, Agent, or Firm* — Posz Law Group, PLC

(57) ABSTRACT

A piezoelectric thin film is formed through sputtering and consists essentially of scandium aluminum nitride. The carbon atomic content is 2.5 at % or less. When producing the piezoelectric thin film, scandium and aluminum are
(Continued)

sputtered simultaneously on a substrate from a scandium aluminum alloy target material having a carbon atomic content of 5 at % or less in an atmosphere where at least nitrogen gas exists. The sputtering may be conducted also by applying an ion beam on an opposing surface of the alloy target material at an oblique angle. Moreover, aluminum and scandium may be also sputtered simultaneously on the substrate from an Sc target material and an Al target material. As a result, a piezoelectric thin film which exhibits excellent piezoelectric properties and a method for the same can be provided.

10 Claims, 2 Drawing Sheets

(51) Int. Cl.
    C04B 35/581    (2006.01)
    C23C 14/06     (2006.01)
    H01L 41/187    (2006.01)
    H01L 41/316    (2013.01)
    C23C 14/18     (2006.01)
    C23C 14/34     (2006.01)
    C23C 14/46     (2006.01)

(52) U.S. Cl.
    CPC ......... *C23C 14/34* (2013.01); *C23C 14/3464* (2013.01); *C23C 14/46* (2013.01); *H01L 41/187* (2013.01); *H01L 41/316* (2013.01)

(56) References Cited

U.S. PATENT DOCUMENTS

2008/0296529 A1    12/2008    Akiyama et al.
2012/0000766 A1     1/2012    Teshigahara et al.

FOREIGN PATENT DOCUMENTS

JP        2013-014806 A     1/2013
JP        2013-148562 A     8/2013
WO        2013/175985 A1   11/2013

OTHER PUBLICATIONS

Zukauskaite. Microstructure and dielectric properties of piezoelectric magnetron sputtered w-ScxAl1-xN thin films. J. Appl. Phys. 111, 093527 (2012); doi: 10.1063/1.4714220.*

International Search Report and Written Opinion of the International Searching Authority mailed Aug. 26, 2014 for the corresponding international application No. PCT/JP2014/002697 (and English translation).

Agne Zukauskaite et al . . . "Microstructure and Dielectric Properties of Piezoelectric Magnetron Sputtered w-ScxAl1-xN thin films", Journal of Applied Physics, May 9, 2012, (111), 9, 093527.

Morito Akiyama et al., "Preparation of scandium aluminum nitride thin films by using scandium aluminum alloy sputtering target and design of experiments", Journal of the Ceramic Society of Japan, Sep. 28, 2010, 118 [12], pp. 1166-1169, Japan.

Kazuki Arakawa et al., "Deposition techniques of c-axis-tilted ScAlN films by conventional RF magnetron sputtering", IEEE International Ultrasonics Symposium Proceedings, 2010, pp. 1050-1053, Japan.

* cited by examiner

PIEZOELECTRIC THIN FILM AND METHOD FOR PRODUCING THE SAME

CROSS REFERENCE TO RELATED APPLICATIONS

This application is a U.S. national stage of International Application No. PCT/JP2014/002697 filed on May 22, 2014 and is based on Japanese Patent Application No. 2013-115477 filed on May 31, 2013, the disclosures of which are incorporated herein by reference.

TECHNICAL FIELD

The present disclosure relates to a piezoelectric thin film consisting essentially of scandium aluminum nitride and a method for producing the same.

BACKGROUND ART

A piezoelectric thin film including scandium aluminum nitride ($Sc_xAl_{1-x}N$; $0<x<1$) is capable of exhibiting a higher piezoelectric coefficient for example than an aluminum nitride thin film and the like. Therefore, it is expected that a piezoelectric thin film will be applied to a surface acoustic wave (SAW) element, a light-emitting layer for a light-emitting diode (LED) having a wide emission wavelength range, a microelectromechanical systems (MEMS) element and the like.

A piezoelectric thin film including scandium aluminum nitride is produced by sputtering scandium and aluminum on a substrate in a nitrogen atmosphere (see Patent Literature 1).

PRIOR ART LITERATURE

Patent Literature

Patent Literature 1: JP 2009-10926 A

SUMMARY OF THE INVENTION

However, piezoelectric thin films including scandium aluminum nitride obtained by sputtering vary in piezoelectric properties. In other words, even when piezoelectric thin films including scandium aluminum nitride with the same ratio of scandium and aluminum are prepared, the piezoelectric properties such as the piezoelectric coefficients vary considerably. Thus, a piezoelectric thin film which exhibits excellent piezoelectric properties may not be always obtained.

The present disclosure is based on the above-described background and provides a piezoelectric thin film which consists essentially of scandium aluminum nitride and which is capable of exhibiting excellent piezoelectric properties and production methods thereof.

The present inventors have found that a cause of the variation in piezoelectric properties is the carbon atoms in the piezoelectric thin films including scandium aluminum nitride. Furthermore, the inventors have found that the piezoelectric properties of a piezoelectric thin film can be improved by controlling the carbon atomic content.

In one aspect of the present disclosure, a piezoelectric thin film is formed through sputtering and consists essentially of scandium aluminum nitride, wherein the piezoelectric thin film has a carbon atomic content of 2.5 at % or less.

In another aspect of the present disclosure, a method for producing the piezoelectric thin film includes a single-target sputtering step of producing the piezoelectric thin film by simultaneously sputtering scandium and aluminum on a substrate from an alloy target material consisting essentially of a scandium aluminum alloy under an atmosphere where at least nitrogen gas exists, wherein the alloy target material consists essentially of a scandium aluminum alloy having a carbon atomic content of 5 at % or less.

In further another aspect of the present disclosure, a method for producing the piezoelectric thin film includes a two-target sputtering step of producing the piezoelectric thin film by simultaneously sputtering aluminum and scandium on a substrate from an Sc target material consisting essentially of scandium and an Al target material consisting essentially of aluminum under an atmosphere where at least nitrogen gas exists, wherein the piezoelectric thin film consists essentially of scandium aluminum nitride represented by a general formula $Sc_xAl_{1-x}N$ ($0<x<1$), and the Sc target material consists essentially of scandium having a carbon atomic content of 5/x at % or less.

In still further another aspect of the present disclosure, a method for producing the piezoelectric thin film includes an ion irradiation sputtering step of producing the piezoelectric thin film by arranging an alloy target material consisting essentially of a scandium aluminum alloy to face a substrate, applying, at an oblique angle, an ion beam to an opposing surface of the alloy target material, and simultaneously sputtering scandium and aluminum on the substrate from the alloy target material, wherein, during the ion irradiation sputtering step, the ion beam including at least a nitrogen ion is applied or the ion beam is applied under an atmosphere where at least nitrogen gas exists.

Effects of the Invention

The piezoelectric thin film consists essentially of scandium aluminum nitride and is obtained through sputtering. During sputtering, a tiny amount of carbon atoms in a target material, which is the raw material, sometimes contaminates a piezoelectric thin film. The contamination of carbon atoms can be a cause of the deterioration of the piezoelectric properties of the piezoelectric thin film, such as the piezoelectric d33 coefficient. Since the above piezoelectric thin film consists essentially of scandium aluminum nitride having a low carbon atomic content, as described above, the piezoelectric thin film is capable of exhibiting excellent piezoelectric properties.

Moreover, when the carbon atomic content of a piezoelectric thin film consisting essentially of scandium aluminum nitride exceeds 2.5 at %, the degree of deterioration of the piezoelectric properties such as the piezoelectric d33 coefficient is greater as the carbon atomic content increases. By adjusting the carbon atomic content to 2.5 at % as described above, the deterioration of the piezoelectric properties can be restricted sufficiently. Accordingly, the piezoelectric thin film according to the present disclosure is capable of exhibiting excellent piezoelectric properties that are comparable also to the piezoelectric properties of a pure piezoelectric thin film which consists essentially of scandium aluminum nitride without including any carbon atoms.

The piezoelectric thin film can be produced by a single-target sputtering step. In other words, the piezoelectric thin film can be produced by simultaneously sputtering aluminum and scandium on a substrate from an alloy target material consisting essentially of a scandium aluminum alloy under an atmosphere where at least nitrogen gas exists.

By using an alloy target material having a carbon atomic content of 5 at % or less, a piezoelectric thin film having a carbon atomic content of 2.5 at % or less can be produced as described above.

Moreover, the piezoelectric thin film can be produced by a two-target sputtering step. In other words, the piezoelectric thin film can be produced by simultaneously sputtering aluminum and scandium on a substrate from an Sc target material consisting essentially scandium and an Al target material consisting essentially of aluminum under an atmosphere where at least nitrogen gas exists. When a thin film consisting essentially of scandium aluminum nitride represented by a general formula $Sc_xAl_{1-x}N$ (0<x<1) is produced as the piezoelectric thin film, an Sc target material having a carbon atomic content of 5/x (at %) or less is used. As a result, a piezoelectric thin film having a carbon atomic content of 2.5 at % or less can be produced as described above.

Furthermore, the piezoelectric thin film can be produced by an irradiation sputtering step. In other words, an alloy target material consisting essentially of a scandium aluminum alloy is arranged to face a substrate, and an ion beam is applied, at an oblique angle, to an opposing surface of the alloy target material. Aluminum and scandium are sputtered simultaneously on the substrate from the alloy target material, and the piezoelectric thin film can be thus produced.

The reason is as follows. The distributions of ejection angles of atoms ejected from a target material by the irradiation with an ion beam (sputtered atoms) vary with the atomic weight. When an atom species has a low atomic weight, the proportion of the atoms which are ejected at the same angle as the incident angle of the ion beam but in the opposite direction is higher than that of an atom species having a high atomic weight.

Thus, the ion beam is applied to the opposing surface of the alloy target material at an oblique angle as with the irradiation sputtering step. Then, because a carbon atom has a lower atomic weight than Sc and Al, most of the carbon atoms included in the alloy target material is ejected at the same angle as the incident angle of the ion beam but in the opposite direction. As a result, the amount of carbon atoms ejected onto the substrate can be reduced to a very low level. Therefore, a piezoelectric thin film having a carbon atomic content of 2.5 at % or less can be produced as described above. In the ion irradiation sputtering step, an ion beam including at least nitrogen ions is applied or an ion beam is applied under an atmosphere where at least nitrogen gas exists. Thus, a piezoelectric thin film consisting essentially of scandium aluminum nitride can be produced by sputtering.

As described above, a piezoelectric thin film having a carbon atomic content of 2.5 at % or less can be produced by a single-target sputtering step, a two-target sputtering step or an irradiation sputtering step. The piezoelectric thin film has a high piezoelectric d33 coefficient and is capable of certainly exhibiting excellent piezoelectric properties.

In this manner, a piezoelectric thin film that is consists essentially of scandium aluminum nitride and that is capable of exhibiting excellent piezoelectric properties and a method for producing the same can be provided according to the present disclosure.

EMBODIMENTS FOR CARRYING OUT INVENTION

Figure 1:
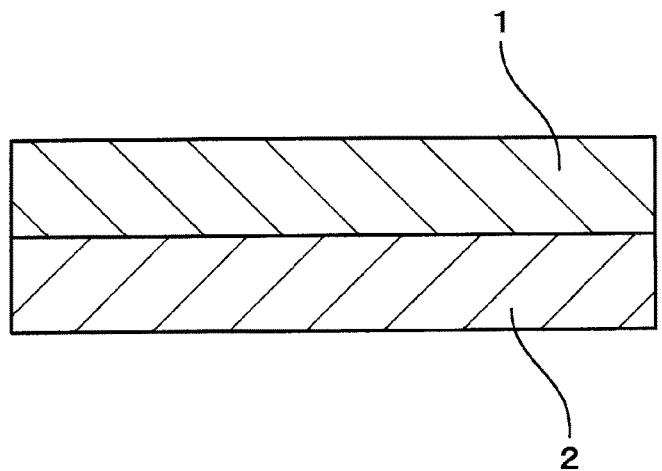
FIG. 1 is an explanatory diagram illustrating the cross-sectional structure of a piezoelectric thin film formed on a substrate according to Example 1.

Next, preferable embodiments of the piezoelectric thin film and the method for producing the same are explained.

The piezoelectric thin film consists essentially of scandium aluminum nitride. Scandium aluminum nitride may be represented by a general formula $Sc_xAl_{1-x}N$ (0<x<1). Preferably, x satisfies $0.05 \leq x \leq 0.5$. In this case, the piezoelectric response of the piezoelectric thin film can be further improved. More preferably, x satisfies $0.15 \leq x \leq 0.45$.

The piezoelectric thin film may be formed on a substrate. For example, a substrate formed of silicon, sapphire, silicon carbide, gallium nitride, lithium niobate, tantalum niobate, crystal, glass, a metal, stainless, Inconel, a polymer film or the like may be used. One example of the polymer film is a polyimide film or the like.

The piezoelectric thin film can be produced by the single-target sputtering step, the two-target sputtering step or the irradiation sputtering step. An alloy target material is used for the single-target sputtering step and the irradiation sputtering step. The ratio of scandium and aluminum in the alloy target material can be appropriately determined according to the ratio of scandium and aluminum in the scandium aluminum nitride with an aimed composition.

An Al target material and an Sc target material are used for the two-target sputtering step. The ratio of scandium and aluminum in the piezoelectric thin film to be produced can be changed in the two-target sputtering step by adjusting the power density during the sputtering.

In the single-target sputtering step and the two-target sputtering step, the power density of each target material can be in the range of from 4.3 to 14 $W/cm^2$ for example. The power density is preferably in the range of from 6.5 to 11 $W/cm^2$. The power density of a target material is derived by dividing the sputtering power by the area of the target material.

The alloy target material and the Sc target material can be produced by high-frequency induction heating or arc melting. A carbon crucible or a crucible including carbon is used for producing the alloy target material and the Sc target material. Carbon atoms in the crucible contaminate the target materials, and the piezoelectric thin film to be obtained also contains the carbon atoms. In the single-target sputtering step and the two-target sputtering step, the carbon atomic content of the piezoelectric thin film to be obtained can be decreased by decreasing the carbon atomic content of the alloy target material and the carbon atomic content of the Sc target material, respectively.

An ion beam is applied to an opposing surface of the alloy target material at an oblique angle during the irradiation sputtering step. In other words, the incident angle of the ion beam is an acute angle relative to the opposing surface. As the incident angle becomes smaller, the carbon atomic content of the piezoelectric thin film can be decreased more. On the other hand, when the incident angle decreases, the generation rate of the piezoelectric film by sputtering tends to decrease. In order to decrease the carbon atomic content sufficiently without significantly decreasing the generation rate, the incident angle of the ion beam is preferably from 15° to 80°, more preferably from 25° to 70°.

Also in the irradiation sputtering step, the carbon atomic content of the alloy target material is preferably low. The carbon atomic content of the alloy target for the irradiation sputtering step can be, for example, 10 at % or less, more preferably 5 at % or less. As a result, the decrease in the carbon atomic content of the piezoelectric thin film can be further ensured.

The sputtering can be conducted in an atmosphere where nitrogen gas exists. Specifically, for example, the sputtering can be conducted under a mixed gas atmosphere of nitrogen gas and an inert gas such as argon gas. When the sputtering is conducted under a mixed gas atmosphere, the nitrogen gas concentration of the mixed gas may be from 25% to 50% by volume. From the viewpoint of the improvement in the piezoelectric response of the piezoelectric thin film, the nitrogen gas concentration is preferably from 30% to 45% by volume.

The sputtering may be conducted at pressure of from 0.1 Pa to 0.8 Pa. Preferably, the sputtering may be conducted at pressure of from 0.1 Pa to 0.4 Pa.

The temperature of the substrate during the sputtering may be in the range of from 18° C. to 600° C. for example. The temperature may be preferably from 200° C. to 400° C.

In the irradiation sputtering step, an ion beam including at least nitrogen ions is applied or an ion beam is applied under an atmosphere where at least nitrogen gas exists. When an ion beam including nitrogen ions is applied, the irradiation sputtering step can be conducted under an atmosphere where Ar gas, nitrogen gas or a mixed gas thereof, for example, exists. When an ion beam is applied under an atmosphere where nitrogen gas exists, an ion beam of argon or the like can be applied. The ion beam of argon or the like may include nitrogen ions.

EXAMPLES

Example 1

Next, an example and a comparative example of the piezoelectric thin film are explained.

In the present example, piezoelectric thin films having different carbon atom (C) contents are produced, and the piezoelectric coefficients are evaluated.

As shown in FIG. 1, a piezoelectric thin film 1 of the present example has been provided on a substrate 2 formed of silicon. The piezoelectric thin film 1 consists essentially of scandium aluminum nitride and contains a tiny amount of carbon.

To produce the piezoelectric thin film 1, a commercially available substrate formed of silicon and a commercially available alloy target material which was in the form of a plate and which consisted essentially of a scandium aluminum alloy ($Sc_{0.45}Al_{0.55}$ alloy) were prepared. The alloy target material was prepared by high-frequency induction heating using a carbon crucible, and the composition ratio of elements of scandium and aluminum was 0.45:0.55 (Sc:Al). In the present example, the Sc content (at %) of an alloy target material and the Sc content (at %) of a piezoelectric thin film described below were calculated based on the analysis results using a wavelength dispersive X-ray fluorescence analyzer ("JXA-8500F" manufactured by JEOL Ltd.).

Next, a piezoelectric thin film was prepared by sputtering Sc and Al included in the alloy target on the substrate under a nitrogen atmosphere using a sputtering system (a high frequency magnetron sputtering system manufactured by ULVAC, Inc.).

Figure 2:
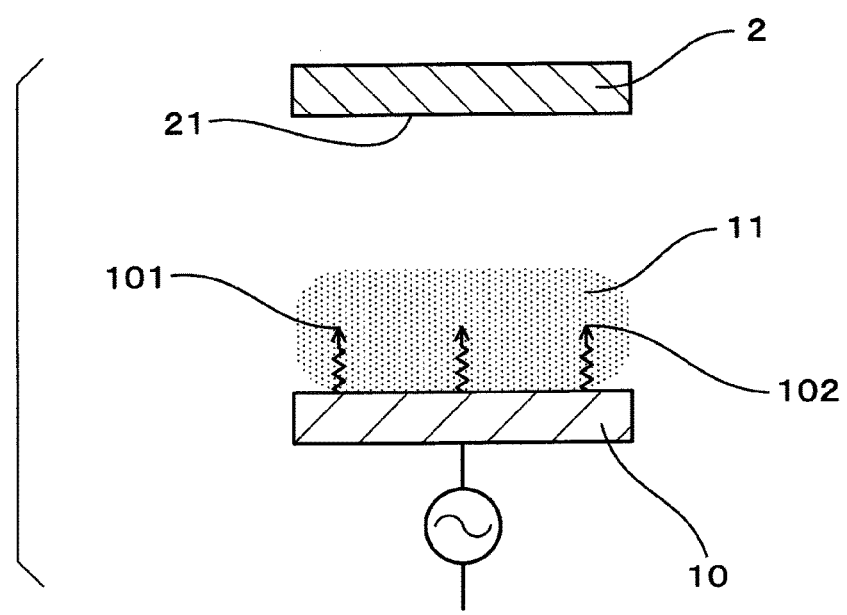
FIG. 2 is an explanatory diagram illustrating the outline of a method for producing a piezoelectric thin film according to Example 1.

Specifically, as shown in FIG. 2, a substrate 2 is arranged in a sputtering chamber to face an alloy target material 10. Then, a scandium 101 and an aluminum 102 were sputtered toward the substrate 2 from the alloy target material 10 under the conditions of a sputtering pressure of 0.16 Pa, a nitrogen concentration of 43% by volume, a target power density of 10 W/cm$^2$, a substrate temperature of 300° C. and a sputtering time of 200 minutes. The pressure in the sputtering chamber was reduced to $5 \times 10^{-5}$ Pa or lower, and argon gas of 99.999% by volume and nitrogen gas of 99.999% by volume were introduced into the chamber. The alloy target material 10 was sputtered under an Ar gas atmosphere for three minutes before the vapor deposition.

As shown in FIG. 2, in the example, an RF voltage was applied to the alloy target material 10, and RF plasma 11 was generated on the surface of the alloy target material 10. Cations in the plasma 11 (nitrogen ions and argon ions) are accelerated and collide with the alloy target material 10 due to the self-bias effect. As shown in FIG. 2, the scandium atom 101 and the aluminum atom 102 are ejected from the alloy target material 10 due to the collisions and sputtered on an opposing surface 21 of the substrate 2 which is arranged to face the alloy target material 10.

In this manner, the piezoelectric thin film 1 consisting essentially of scandium aluminum nitride was produced on the substrate 2 (see FIG. 1). In this regard, although the present example has been explained by an example where an RF voltage was applied, the piezoelectric thin film 1 can be produced similarly also by applying a DC voltage.

The X-ray diffraction intensity of the obtained piezoelectric thin film 1 was measured with a fully automatic X-ray diffractometer using CuKα ray ("M03X-HF" manufactured by Mac Science Co., Ltd.). As a result, a diffraction peak was observed at 2θ=36° to 37°. Thus, the production of the piezoelectric thin film 1 made of scandium aluminum nitride was confirmed.

In addition, the composition of the piezoelectric thin film 1 was analyzed using the wavelength dispersive X-ray fluorescence analyzer, and the Sc atom content was 43 at % relative to the total (100 at %) of the number of Sc atoms and the number of Al atoms. In other words, x was 0.43 in the general formula of scandium aluminum nitride, $ScAl_{1-x}N$.

In the present example, piezoelectric thin films (samples 1 to 9) were produced using target materials of scandium aluminum alloys having different carbon atom (C) contents as the alloy target material.

The piezoelectric thin film samples were prepared similarly except for the kinds of alloy target material, that is, alloy target materials having different C contents (at %) were used.

The C contents (at %) of the alloy target materials used for preparing the respective samples and the C contents (at %) of the obtained piezoelectric thin films are shown in Table 1 below.

The C contents (at %) were measured by secondary ion mass spectrometry (SIMS).

Specifically, the C contents were measured with an SIMS apparatus "IMS 7f" manufactured by CAMECA under the conditions of primary ion species of Cs$^+$, primary ion-accelerating energy of 15 keV, secondary ion with negative polarity and electrification compensation of metal coat/E-gun. The C content of an alloy target material is the C atom content (at %) of the alloy target relative to the total (100 at %) of the number of Sc atoms and the number of Al atoms. Moreover, the C content of a piezoelectric thin film is the C atom content (at %) of the piezoelectric thin film relative to the total (100 at %) of the number of Sc atoms, the number of Al atoms and the number of N atoms.

Next, the piezoelectric d33 coefficients (pC/N) of the respective piezoelectric thin film samples were measured. The piezoelectric d33 coefficients were measured with a piezometer ("PM200" manufactured by Piezotest Pte Ltd) under the conditions of a load of 0.25 N and a frequency of 110 Hz. The results are shown in Table 1.

Figure 3:
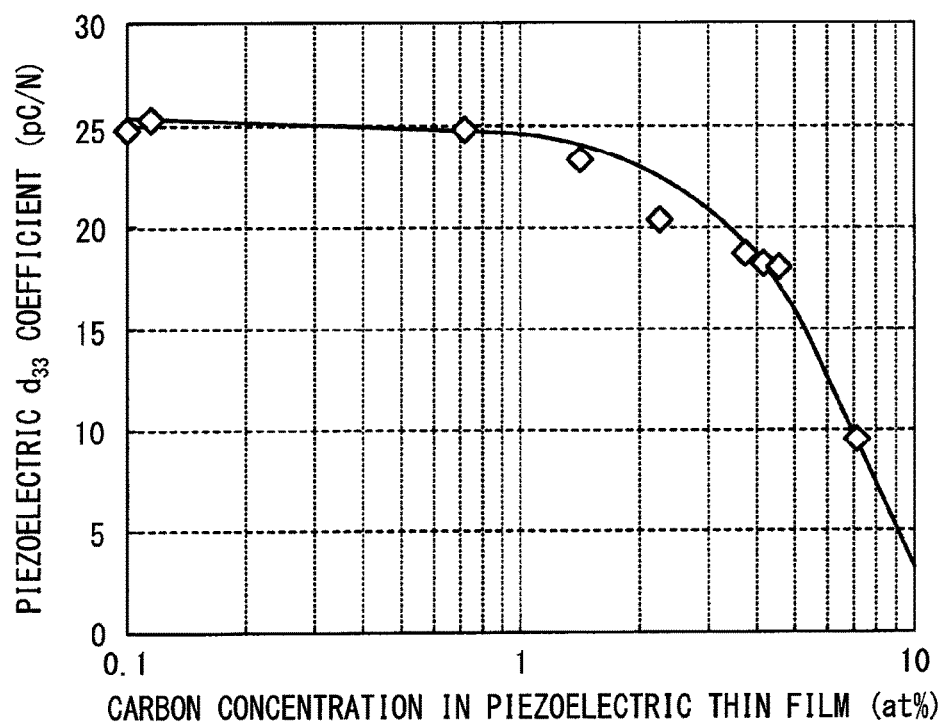
FIG. 3 is a an explanatory diagram showing the relation between the carbon atomic contents (at %) of the piezoelectric thin films and the piezoelectric d33 coefficients (pC/N) of the piezoelectric thin films according to Example 1.

Based on Table 1, the relation between the C contents (at %) of the piezoelectric thin films and the piezoelectric d33 coefficients of the piezoelectric thin films is shown in FIG. 3.

TABLE 1

| | Sample No. | | | | | | | | |
|---|---|---|---|---|---|---|---|---|---|
| | 1 | 2 | 3 | 4 | 5 | 6 | 7 | 8 | 9 |
| C content (at %) of alloy target | 0.2 | 0.25 | 1.44 | 2.99 | 4.59 | 7.53 | 8.34 | 9.15 | 14.29 |
| C content (at %) of piezoelectric thin film | 0.1 | 0.12 | 0.72 | 1.5 | 2.29 | 3.76 | 4.17 | 4.58 | 7.15 |
| Piezoelectric d33 coefficient (pC/N) | 24.7 | 25.2 | 24.7 | 23.2 | 20.4 | 18.7 | 18.2 | 18 | 9.5 |

As seen from Table 1 and FIG. 3, it is understood that the piezoelectric d33 coefficient of the piezoelectric thin film consisting essentially of scandium aluminum nitride decreases exponentially as the carbon atomic content of the piezoelectric thin film increases. By adjusting the carbon atomic content of the piezoelectric thin film to 2.5 at % or less, the decrease in the piezoelectric d33 coefficient, in which the carbon atomic content involves, can be made small, and the piezoelectric thin film is capable of exhibiting a high piezoelectric d33 coefficient exceeding 20 pC/N (see FIG. 3). The carbon atomic content of the piezoelectric thin film is more preferably 1.5 at % or less, further preferably 0.75 at % or less.

A scandium aluminum alloy target having a carbon atomic content of 5 at % or less may be used to adjust the carbon atomic content of the piezoelectric thin film to 2.5 at % or less as described above (see Table 1 and FIG. 3). Furthermore, a scandium aluminum alloy target having a carbon atomic content of 3 at % or less may be used to obtain a piezoelectric thin film having a carbon atomic content of 1.5 at % or less. In addition, a scandium aluminum alloy target having a carbon atomic content of 1.5 at % or less may be used to obtain a piezoelectric thin film having a carbon atomic content of 0.75 at % or less.

(Modification 1)

In Example 1, the piezoelectric thin films were prepared by a single-target sputtering step using alloy target materials each including a scandium aluminum alloy. However, a piezoelectric thin film can be produced also by a two-target sputtering step using an Sc target material consisting essentially of scandium and an Al target material consisting essentially of aluminum. In this case, a piezoelectric thin film can be produced in a similar manner as in Example 1, except that aluminum and scandium are sputtered simultaneously on a substrate from an Sc target material and an Al target material.

Carbon is included in the Sc target material, not in the Al target, in a two-target sputtering step like the step of the present modification. The carbon contaminates during the production of the Sc target like the alloy target materials in Example 1. Here, as demonstrated in Example 1, the carbon atomic content of the piezoelectric thin film consisting essentially of scandium aluminum nitride may be preferably 2.5 at % or less from the viewpoint of the improvement in the piezoelectric properties.

Accordingly, in order to obtain a piezoelectric thin film consisting essentially of scandium aluminum nitride represented by a general formula $Sc_xAl_{1-x}N$ ($0<x<1$) by a two-target sputtering step, an Sc target material having a carbon atomic content of $5/x$ (at %) or less may be preferably used. Furthermore, an Sc target having a carbon atomic content of $3/x$ (at %) or less may be used to obtain a piezoelectric thin film having a carbon atomic content of 1.5 at % or less. In addition, an Sc target having a carbon atomic content of $1.5/x$ (at %) or less may be used to obtain a piezoelectric thin film having a carbon atomic content of 0.75 at % or less. The carbon atomic content of an Sc target material is the carbon atomic content of the Sc target material relative to Sc 100 at %.

Example 2

In the present example, a piezoelectric thin film consisting essentially of scandium aluminum nitride is produced by an ion irradiation sputtering step, where the sputtering is conducted by applying an ion beam to an opposing surface of an alloy target material at an oblique angle.

Figure 4:
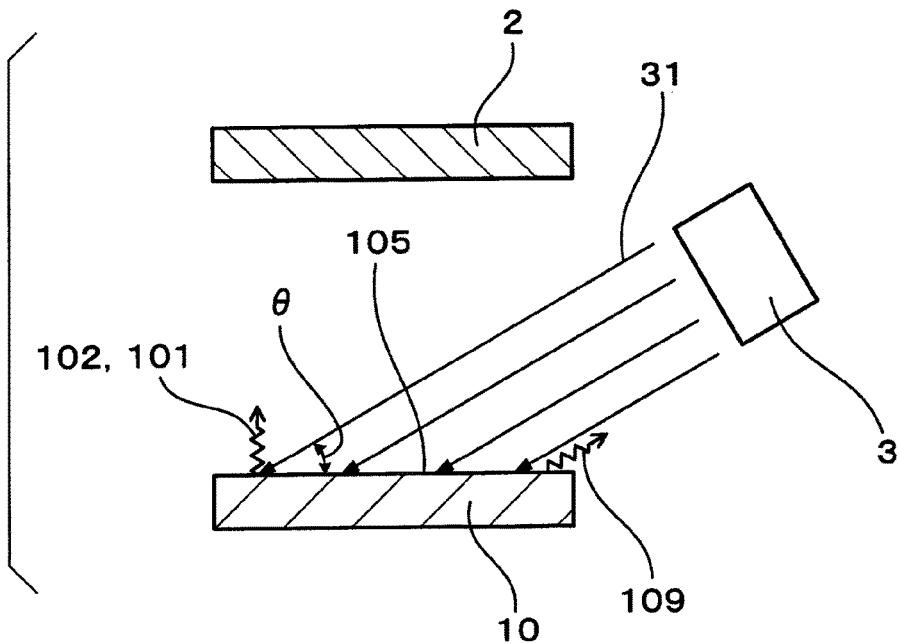
FIG. 4 is an explanatory diagram illustrating the outline of a method for producing the piezoelectric thin film according to Example 2.

Specifically, an alloy target material 10 including a scandium aluminum alloy was provided with the opposing surface facing a substrate 2 as in Example 1 (see FIG. 4).

A silicon substrate similar to the silicon substrate of Example 1 can be used as the substrate 2. A scandium aluminum alloy target material having a carbon content of for example 5 at % or less, as in Example 1, may also be used as the alloy target material 10. Alternatively, however, an alloy target material having a carbon content exceeding 5 at % may also be used.

As shown in FIG. 4, an ion beam 31 including nitrogen ions was applied to an opposing surface 105 of the alloy target material 10 at an oblique angle using an ion gun 3, where the opposing surface 105 is the surface of the alloy target material 10, which was in the form of a plate, facing the substrate 2. The ion beam 31 was applied in an argon gas atmosphere. In the present example, the ion beam 31 was applied in such a manner that the angle θ between the irradiation direction of the ion beam 31 and the opposing surface 105 of the alloy target material became 45°. Aluminum 101 and scandium 102 were thus sputtered simultaneously on the substrate 2 from the alloy target material 10, and a piezoelectric thin film consisting essentially of scandium aluminum nitride was obtained.

When the ion beam 31 is applied at an oblique angle as in the present example, the proportion of carbon atoms with a low atomic weight that are ejected at the same angle as the incident angle of the ion beam 31 but in the opposite direction is higher than those of scandium atoms and aluminum atoms, which have high atomic weights. FIG. 4 illustrates carbon atoms 109 which are ejected in the opposite direction to the incident direction. Most of the carbon atoms 109 included in the alloy target material 10 is ejected at the same angle as the incident angle of the ion beam 31 but in the opposite direction as shown in the figure, and thus the amount of carbon atoms ejected onto the substrate 2 can be reduced to a very low level. Accordingly, also by the ion irradiation sputtering step of the present example, a piezoelectric thin film having a low carbon atomic content, namely 2.5 at % or less, can be produced.

In the example of the ion irradiation sputtering step, the piezoelectric thin film was produced by applying the ion beam 31 including nitrogen ion gas in an Ar gas atmosphere, but the ion beam 31 may not have to include nitrogen ions. In other words, a piezoelectric thin film consisting essentially of scandium aluminum nitride may be produced also by applying an ion beam of argon or the like (an Ar ion beam) under an atmosphere where nitrogen gas exists. Also in the case, a piezoelectric thin film having a low carbon atomic content, namely 2.5 at % or less, may be produced by applying the ion beam at an oblique angle.

The invention claimed is:

1. A piezoelectric thin film that is formed through sputtering and consists essentially of scandium aluminum nitride, wherein
the piezoelectric thin film has a carbon atomic content between 0.1 at % and 2.5 at %.

2. The piezoelectric thin film according to claim 1, wherein
the carbon atomic content of the piezoelectric thin film is between 0.1 at % and 1.5 at %.

3. The piezoelectric thin film according to claim 1, wherein
the carbon atomic content of the piezoelectric thin film is between 0.1 at % and 0.75 at %.

4. A method for producing the piezoelectric thin film according to claim 1, the method comprising:
a single-target sputtering step of producing the piezoelectric thin film by simultaneously sputtering scandium and aluminum on a substrate from an alloy target material consisting essentially of a scandium aluminum alloy having a carbon content of 0.2 through 5.0 at % under an atmosphere where at least nitrogen gas exists.

5. The method for producing the piezoelectric thin film according to claim 4, wherein
the alloy target material consists essentially of a scandium aluminum alloy having a carbon atomic content of 3 at % or less.

6. The method for producing the piezoelectric thin film according to claim 4, wherein
the alloy target material consists essentially of a scandium aluminum alloy having a carbon atomic content of 1.5 at % or less.

7. A method for producing the piezoelectric thin film according to claim 1, the method comprising:
a two-target sputtering step of producing the piezoelectric thin film by simultaneously sputtering aluminum and scandium on a substrate from an Sc target material consisting essentially of scandium having a carbon atomic content of 0.2/x through 5/x at % and an Al target material consisting essentially of aluminum under an atmosphere where at least nitrogen gas exists, wherein
the piezoelectric thin film consists essentially of scandium aluminum nitride represented by a general formula $Sc_xAl_{1-x}N$ (0<x<1).

8. The method for producing the piezoelectric thin film according to claim 7, wherein
the Sc target material consists essentially of scandium having a carbon atomic content of 3/x at % or less.

9. The method for producing the piezoelectric thin film according to claim 7, wherein
the Sc target material consists essentially of scandium having a carbon atomic content of 1.5/x at % or less.

10. A piezoelectric thin film consisting essentially of scandium aluminum nitride including carbon in an amount of 0.1 at % through 2.5 at %, wherein the piezoelectric thin film is prepared by a method comprising:
an ion irradiation sputtering step of producing the piezoelectric thin film by
arranging a surface of an alloy target material to face a substrate, the alloy target material consisting essentially of a scandium aluminum alloy including a carbon content of 10 at % or less,
applying, at an oblique angle, an ion beam to the surface of the alloy target material facing the substrate, and
simultaneously sputtering scandium and aluminum on the substrate from the alloy target material, wherein
during the ion irradiation sputtering step, the ion beam including at least a nitrogen ion is applied or the ion beam is applied under an atmosphere where at least nitrogen gas exists.

* * * * *